US011743666B2

United States Patent
Malandruccolo et al.

(10) Patent No.: US 11,743,666 B2
(45) Date of Patent: Aug. 29, 2023

(54) MICROPHONE ASSEMBLY WITH TRANSDUCER SENSITIVITY DRIFT COMPENSATION AND ELECTRICAL CIRCUIT THEREFOR

(71) Applicant: Knowles Electronics, LLC, Itasca, IL (US)

(72) Inventors: Vezio Malandruccolo, Rapperswil (CH); Mark Niederberger, Einsiedeln (CH); Luca Bettini, Zurich (CH); Weiwen Dai, Elgin, IL (US)

(73) Assignee: KNOWLES ELECTRONICS, LLC., Itasca, IL (US)

( * ) Notice: Subject to any disclaimer, the term of this patent is extended or adjusted under 35 U.S.C. 154(b) by 255 days.

(21) Appl. No.: 17/138,487

(22) Filed: Dec. 30, 2020

(65) Prior Publication Data
US 2022/0210591 A1 Jun. 30, 2022

(51) Int. Cl.
| | | |
|---|---|---|
| *H04R 29/00* | (2006.01) | |
| *H04R 3/00* | (2006.01) | |
| *H04R 1/04* | (2006.01) | |
| *B81B 7/00* | (2006.01) | |
| *H04R 19/04* | (2006.01) | |

(52) U.S. Cl.
CPC ........... *H04R 29/004* (2013.01); *B81B 7/008* (2013.01); *H04R 1/04* (2013.01); *H04R 3/00* (2013.01); *H04R 19/04* (2013.01); *B81B 2201/0257* (2013.01); *B81B 2207/03* (2013.01); *H04R 2201/003* (2013.01)

(58) Field of Classification Search
CPC ........ H04R 29/004; H04R 3/00; H04R 19/04; H04R 2201/003; B81B 2201/0257
See application file for complete search history.

(56) References Cited

U.S. PATENT DOCUMENTS

| | | |
|---|---|---|
| 7,190,038 B2 | 3/2007 | Dehe et al. |
| 7,473,572 B2 | 1/2009 | Dehe et al. |
| 7,781,249 B2 | 8/2010 | Laming et al. |
| 7,795,695 B2 | 9/2010 | Weigold et al. |
| 7,825,484 B2 | 11/2010 | Martin et al. |
| 7,829,961 B2 | 11/2010 | Hsiao |
| 7,856,804 B2 | 12/2010 | Laming et al. |
| 7,903,831 B2 | 3/2011 | Song |
| 2005/0207605 A1* | 9/2005 | Dehe ...................... H04R 19/04 381/369 |

(Continued)

FOREIGN PATENT DOCUMENTS

| | | | | |
|---|---|---|---|---|
| CN | 106878893 A | * | 6/2017 | ............... G01K 7/00 |
| CN | 109644307 A | * | 4/2019 | ........... B81B 7/0048 |
| TW | I287352 B | * | 9/2007 | ........... H03G 3/3026 |

*Primary Examiner* — Oyesola C Ojo
(74) *Attorney, Agent, or Firm* — FOLEY & LARDNER LLP

(57) ABSTRACT

The disclosure relates generally to microphone and vibration sensor assemblies (100) having a transducer (102), like a microelectromechanical systems (MEMS) device, and an electrical circuit (103) disposed in a housing (110) configured for integration with a host device. The electrical circuit includes a transducer bias circuit that applies a bias to the transducer and a bias control circuit (204) that compensates for transducer sensitivity drift caused by variation in an environmental condition of the transducer, and electrical circuits therefor.

20 Claims, 4 Drawing Sheets

(56) References Cited

U.S. PATENT DOCUMENTS

| | | |
|---|---|---|
| 2007/0278501 A1 | 12/2007 | MacPherson et al. |
| 2008/0175425 A1 | 7/2008 | Roberts et al. |
| 2008/0267431 A1 | 10/2008 | Leidl et al. |
| 2008/0279407 A1 | 11/2008 | Pahl |
| 2008/0283942 A1 | 11/2008 | Huang et al. |
| 2009/0001553 A1 | 1/2009 | Pahl et al. |
| 2009/0180655 A1 | 7/2009 | Tien et al. |
| 2010/0046780 A1 | 2/2010 | Song |
| 2010/0052082 A1 | 3/2010 | Lee et al. |
| 2010/0128914 A1 | 5/2010 | Khenkin |
| 2010/0166228 A1* | 7/2010 | Steele ............ A61B 8/56 381/113 |
| 2010/0183181 A1 | 7/2010 | Wang |
| 2010/0242611 A1* | 9/2010 | Terazawa ........ G01S 15/931 73/629 |
| 2010/0246877 A1* | 9/2010 | Wang ............ B81B 7/0061 381/361 |
| 2010/0290644 A1 | 11/2010 | Wu et al. |
| 2010/0322443 A1 | 12/2010 | Wu et al. |
| 2010/0322451 A1 | 12/2010 | Wu et al. |
| 2011/0013787 A1 | 1/2011 | Chang |
| 2011/0075875 A1 | 3/2011 | Wu et al. |
| 2012/0269363 A1* | 10/2012 | Suvanto ............ H04R 1/04 381/107 |
| 2015/0137834 A1* | 5/2015 | Steiner ............ H04R 19/04 324/686 |
| 2016/0087596 A1* | 3/2016 | Yurrtas ............ H04R 1/04 381/111 |
| 2017/0243577 A1* | 8/2017 | Wingate ............ G10L 15/22 |
| 2018/0359551 A1* | 12/2018 | Yang ............ H04R 31/006 |
| 2019/0387326 A1 | 12/2019 | Hansen et al. |
| 2020/0010315 A1 | 1/2020 | Tingleff et al. |
| 2021/0396795 A1 | 12/2021 | Jennings et al. |

\* cited by examiner

MICROPHONE ASSEMBLY WITH TRANSDUCER SENSITIVITY DRIFT COMPENSATION AND ELECTRICAL CIRCUIT THEREFOR

FIELD OF THE DISCLOSURE

The present disclosure relates generally to microphone and other sensor assemblies and more particularly to sensor assemblies having transducer sensitivity drift compensation, and electrical circuits therefor.

BACKGROUND

Microphones having a transducer that converts sound into an electrical signal conditioned or processed by an integrated circuit are known generally and integrated with cell phones, personal computers, smart speakers, and internet of things (IoT) devices, among other host devices. The transducer is commonly implemented as a microelectromechanical systems (MEMS) device. However the sensitivity of these and other transducers tends to drift with variations in temperature and other environmental conditions of the host device. Such sensitivity drift can adversely affect the performance of the microphone.

BRIEF DESCRIPTION OF THE DRAWINGS

The objects, features and advantages of the present disclosure will become more fully apparent from the following description and appended claims, taken in conjunction with the accompanying drawings. The drawings depict only representative embodiments and are therefore not considered to limit the scope of the disclosure, the description of which includes additional specificity and detail.

Those of ordinary skill in the art will appreciate that the figures are illustrated for simplicity and clarity and therefore may not be drawn to scale and may not include well known features, that the order of occurrence of actions or steps may be different than the order described or be performed concurrently unless specified otherwise, and that the terms and expressions used herein have the meaning understood by those of ordinary skill in the art except where different meanings are attributed to them herein.

DETAILED DESCRIPTION

The present disclosure relates generally to microphone and other sensor assemblies comprising a transducer subject to varying environmental conditions like temperature, humidity, and pressure among others that causes sensitivity drift affecting the performance of the sensor assembly, and more particularly to sensor assemblies and electrical circuits for such sensor assemblies that compensate for transducer sensitivity drift.

Figure 1:
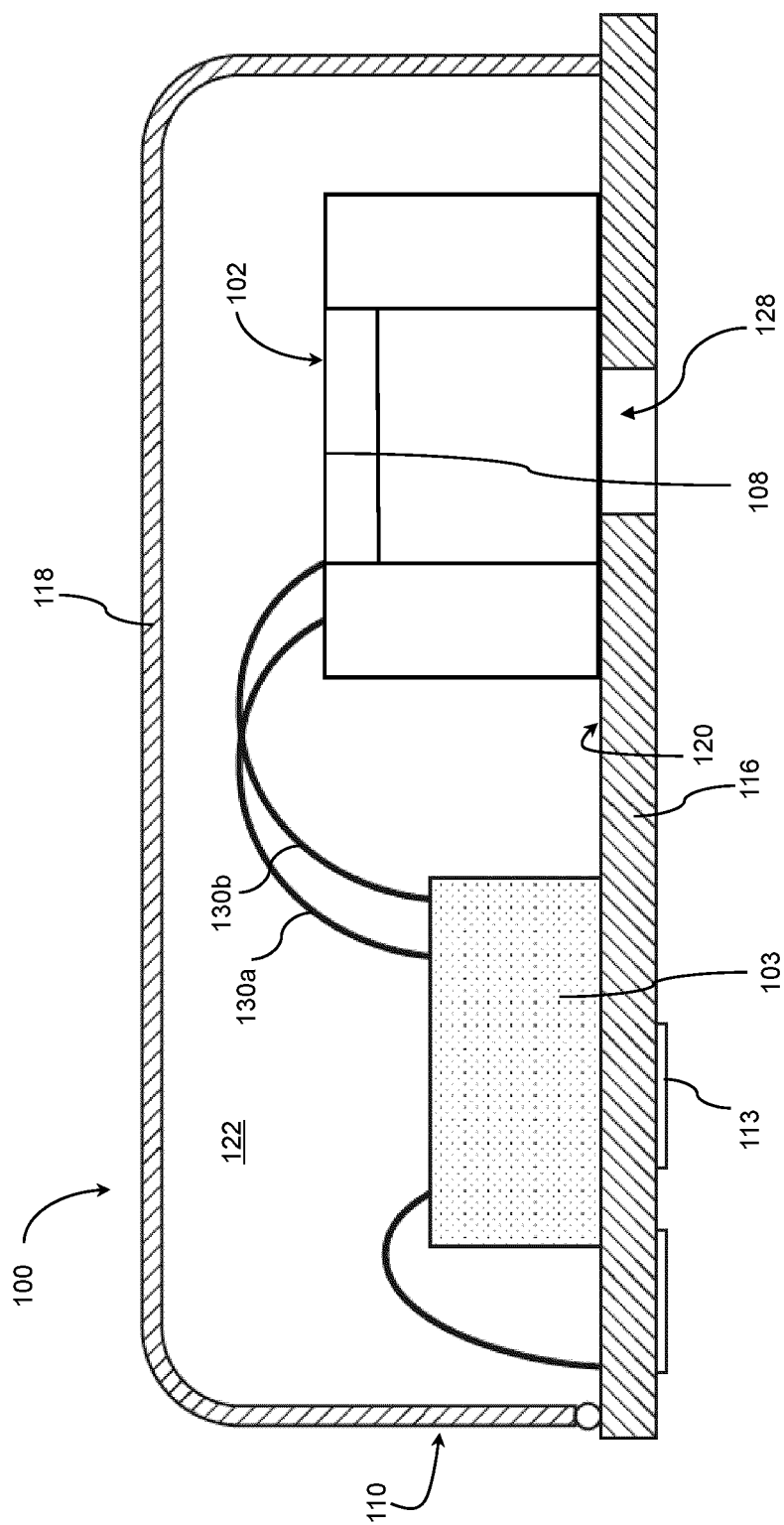
FIG. 1 is a cross-sectional view of a sensor assembly.

The sensor assembly generally comprises a transducer and an electrical circuit disposed in a housing configured to interface with a host device. FIG. 1 is a cross-sectional view of a sensor assembly 100 comprising a transducer 102 coupled to an electrical circuit 103 disposed within a housing 110. The housing includes a substrate 116 and a cover 118 fastened to an upper surface 120 of the substrate. The housing also includes an electrical interface with contacts (e.g., supply, ground, data, clock, select, etc.) configured to interface with a host device. In FIG. 1, the host-interface is a surface-mount interface 113 located on an outer surface of the substrate 116 and is suitable for reflow soldering processes. In other embodiments, the host-interface can have some other form factor, like through-hole pins, or be located on some part of the housing.

In some sensor assemblies, like microphones, the housing includes an aperture (also called a "port" herein) connecting an interior of the housing to the external environment. In FIG. 1, the housing port 128 is located on the substrate 116 in alignment with the transducer 102. In other sensor assemblies, the port can be on some other part of the housing, like the cover or sidewall. Other sensor assemblies, like acoustic vibration sensors and accelerometers among others, do not require a port. Transducer sensitivity drift can be caused by variations in environmental conditions like humidity that propagate through the port and by other variations like temperature in the absence of a port.

In one embodiment, the sensor assembly is a microphone and the transducer is configured to detect atmospheric acoustic signals and generate an electrical signal representative of the signals detected. In other embodiments, the transducer and electrical circuit are configured to detect and generate electrical signals representative of acoustic vibrations, pressure, acceleration, humidity and temperature among other conditions. The transducer may be a capacitive, piezoelectric, optical or other transduction device implemented as a microelectromechanical systems (MEMS) device or as some other known or future device.

Figure 2:
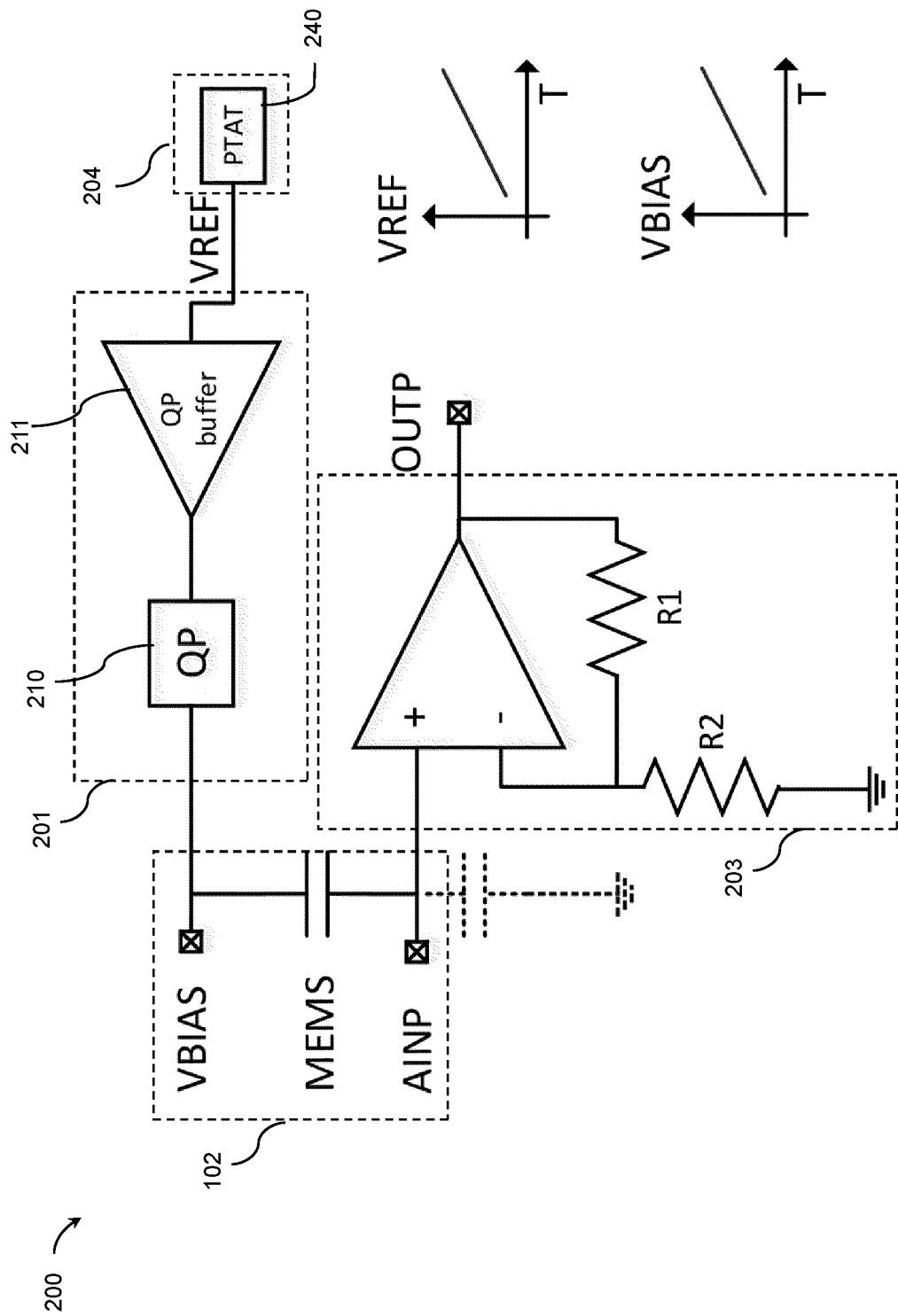
FIG. 2 is a schematic block diagram of a sensor assembly.
Figure 3:
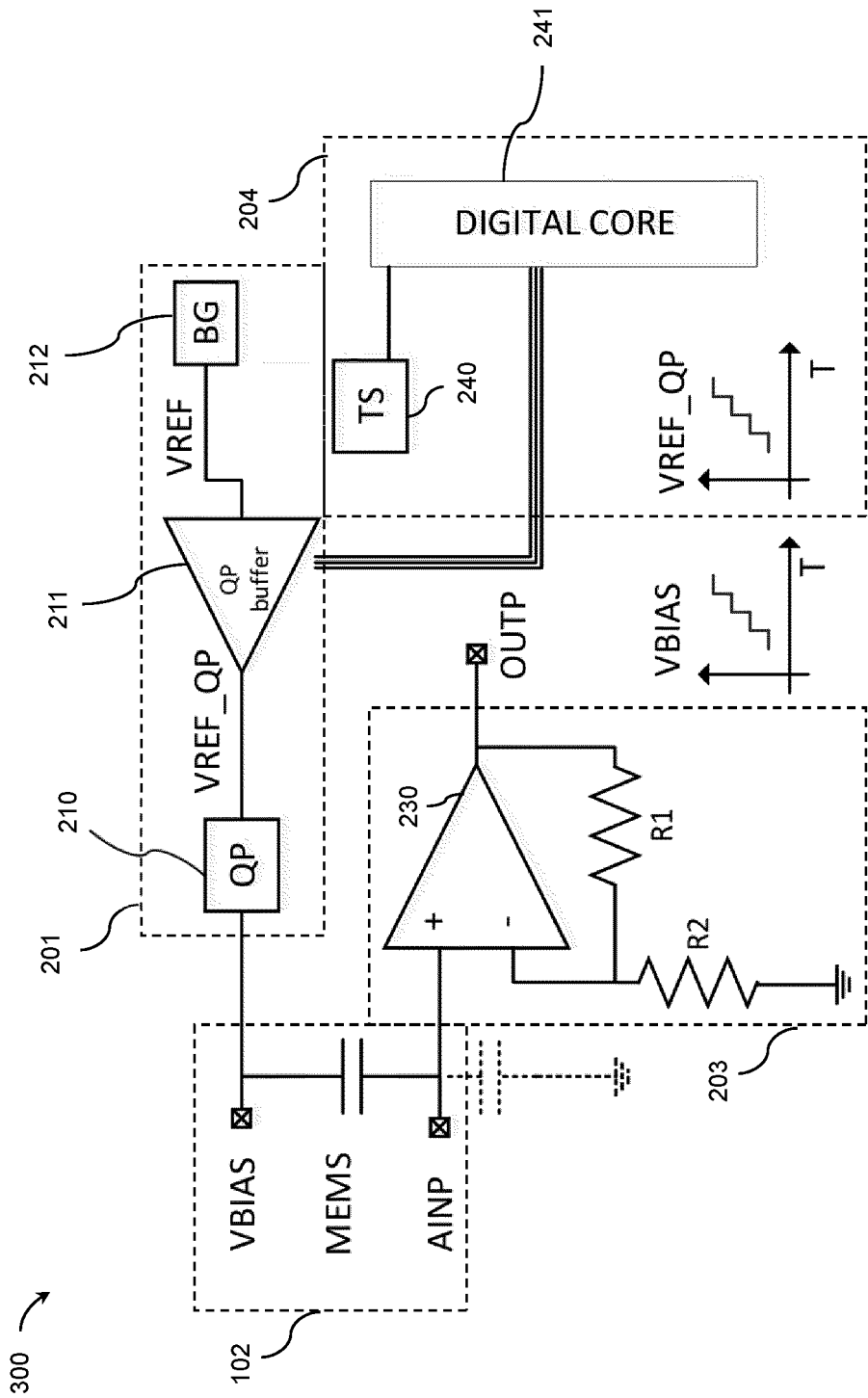
FIG. 3 is a schematic block diagram of an alternative sensor assembly.
Figure 4:
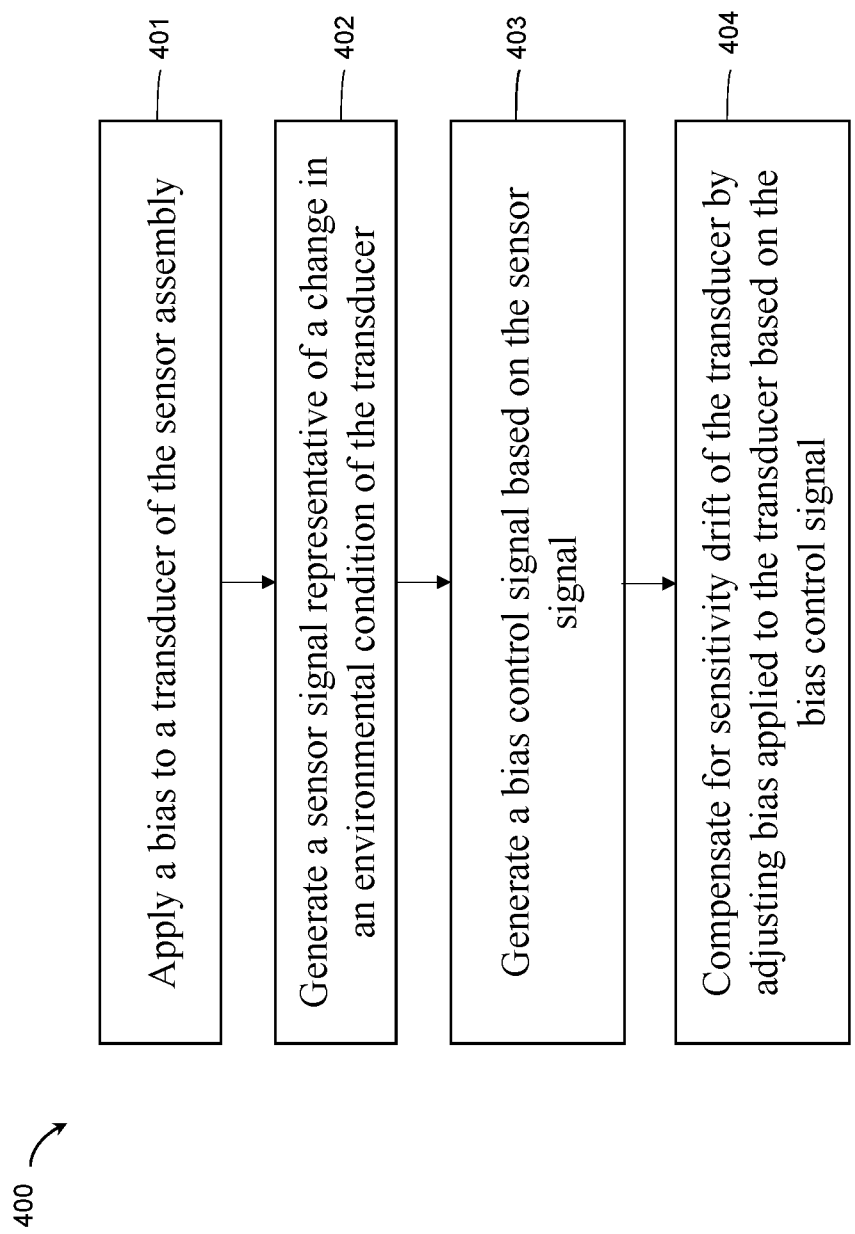
FIG. 4 depicts a flow diagram of a method of operating a sensor assembly.

The electrical circuit generally comprises a processing circuit configured to process the electrical signal produced by the transducer and to provide the processed output signal at the host interface of the sensor assembly. In FIG. 1, the electrical circuit 103 is coupled to the transducer 102 via leads 130a and 130b and to contacts on the host interface 113 for this purpose. The electrical circuit also comprises a transducer bias circuit coupled to the transducer and configured to apply a bias signal, e.g., a bias voltage VBIAS, to the transducer. Such bias circuits are commonly used to bias capacitive transducers that do not have a permanent or quasi-permanent electric field. In FIGS. 2-3, a transducer 102 is coupled to a transducer bias circuit 201 comprising a charge pump 210 and a buffer 211 having a reference input, wherein the output of the charge pump is based on a reference signal applied to the reference input. In FIG. 2, the reference signal is obtained from a source having a variable reference signal described further herein. In FIG. 3, the reference signal is obtained from a band gap reference 212 having a fixed reference signal. Other transducer bias circuits can be used in other implementations. In the sensor assembly operational process of FIG. 4, at block 401, the bias circuit applies a bias to the transducer of the sensor assembly.

According to one aspect of the disclosure, the sensor assembly comprises a bias control circuit comprising an environmental sensor configured to generate an environmental sensor signal based on a detected change in an environmental condition affecting sensitivity drift in the transducer. The environmental sensor is located in proximity to the transducer and the bias control circuit can be calibrated to provide an appropriate bias control signal based on the environmental sensor signal. In the sensor assembly operational process of FIG. 4, at block 402, the environmental sensor generates an environmental sensor signal representative of a change in an environmental condition causing sensitivity drift in the transducer, and at block 403 the bias control circuit generates a bias control signal based on the environmental sensor signal.

The transducer bias circuit is coupled to the bias control circuit and configured to adjust a bias applied to the transducer based on the bias control signal. The bias adjustment compensates for the sensitivity drift of the transducer caused by the change in the environmental condition sensed by the environmental sensor. In the sensor assembly operational process of FIG. 4, at block 404, the bias control circuit compensates for sensitivity drift of the transducer by adjusting a bias applied to the transducer based on the bias control signal. The bias control circuit including the environmental sensor can be integrated, along with the signal processing circuit, as part of an integrated circuit (IC) of the sensor assembly.

In one implementation, the bias control circuit is implemented as an analog circuit that generates a variable analog signal used to control a bias applied to the transducer. In FIG. 2, the bias control circuit 204 comprises an environmental sensor 240 having an output coupled to the buffer 211 of the transducer bias circuit. The environmental sensor is configured to detect, and generate a variable reference signal, based on variation in the environmental condition. The variable reference signal applied to the buffer controls the bias voltage generated by the charge pump. Thus the variable analog reference signal can be used to adjust the bias applied to the transducer. In one implementation, the environmental sensor produces a variable reference signal (e.g., a variable voltage or current) having a positive or negative slope. Thus the variable analog reference signal can be used to adjust the bias applied to the transducer. One such environmental sensor suitable for detecting temperature variations is a proportional to absolute temperature (PTAT) device, wherein the bias voltage applied to the transducer changes in proportion to changes in temperature. More generally, the environmental sensor can comprise any sensor that generates a variable reference signal representative of variations in the environmental condition affecting the sensitivity of the transducer.

In another implementation, the bias control circuit is implemented as a digital circuit that generates a digital signal used to control a bias applied to the transducer. In FIG. 3, the bias control circuit 204 comprises an environmental sensor 240 coupled to a digital logic circuit 241. The digital logic circuit is configured to determine a bias value based on the environmental sensor signal, wherein the bias control signal is based on the bias value. The logic circuit can obtain the bias value by reference to a look-up table (LUT) that relates environmental sensor signal values to corresponding bias values. The LUT data can be stored in a one-time programmable (OTP) memory during manufacture of the sensor assembly. Alternatively, the logic circuit can be implemented as a digital processor that obtains the bias value by executing an algorithm that determines the bias value based on a function of the environmental sensor signal. In FIG. 3, the buffer 211 outputs a reference signal to the charge pump 210 based on a fixed reference signal applied by a band gap reference 212. The digital logic circuit 241 also has an output coupled to the buffer 211 of the transducer bias circuit 201, wherein the transducer bias circuit adjusts the bias applied to the transducer based on the variable output from the digital logic circuit. The environmental sensor 240 can be part of the integrated circuit including the signal processing and digital logic circuits. Alternatively, the environmental sensor can be physically separated from the integrated circuit and instead be integrated with the transducer or be located on or embedded in the substrate.

The electrical circuit can also comprise a signal processing circuit coupled to the transducer and configured to process the electrical signal from the transducer prior to providing the processed signal at the host interface of the sensor assembly. In FIGS. 2-3, the transducer is coupled to a signal processing circuit 203 comprising an amplifier 230. The amplifier can be a low noise amplifier (LNA) or a buffer-amp among others. In other implementations, the signal processing circuit can include some other circuits in combination with, or in lieu of, the amplifier. Such other signal processing circuits include a buffer, filter and analog-to-digital converter (ADC), among other circuits.

In some implementations, the sensor assembly is a microphone or acoustic vibration sensor assembly comprising a digital or analog transducer bias control circuit that compensates for transducer sensitivity drift caused by variations in environmental temperature, as described herein.

In microphones and some other sensor assemblies, the input impedance of the processing circuit is selected to produce a desired electronic low frequency roll off (LFRO) based on an impedance of the transducer. For example a transducer with a capacitance on the order of 1 picofarad (pF) coupled to a variable gain low-noise amplifier having an input resistance on the order of 1 gigaohm (Gohm) would produce an LFRO of about 1.6 Hertz (Hz). Other corner frequencies can be selected by appropriate selection of the transducer capacitance and input resistance of the processing circuit. These selected capacitance and resistance values and corresponding LFRO are merely examples and are not intended to limit the scope of the disclosure. In microphones for example the LFRO may be lower than 1.6 Hz and as high as 100 Hz or more, depending on noise conditions.

While the disclosure and what is presently considered to be the best mode thereof has been described in a manner establishing possession and enabling those of ordinary skill in the art to make and use the same, it will be understood and appreciated that there are many equivalents to the select embodiments described herein and that myriad modifications and variations may be made thereto without departing from the scope and spirit of the invention, which is to be limited not by the embodiments described but by the appended claims and their equivalents.

What is claimed is:

1. A sensor assembly comprising:
a housing having an external-device interface;
a capacitive transducer disposed in the housing and configured to generate an electrical signal;
a bias control circuit comprising an environmental sensor configured to generate an environmental sensor signal based on change in an environmental condition affecting drift in sensitivity of the transducer; and
an integrated circuit disposed in the housing and electrically coupled to contacts of the external-device interface, the integrated circuit comprising:
a transducer bias circuit coupled to the transducer and to the bias control circuit, the transducer bias circuit configured to adjust the bias applied to the transducer based on the environmental sensor signal;
wherein adjustment of the bias compensates for drift in sensitivity of the transducer caused by the change in the environmental condition.

2. The sensor assembly of claim 1, wherein the transducer bias circuit includes a reference input and is configured to generate a bias control signal based on the environmental sensor signal received at the reference input, wherein adjustment of the bias applied to the transducer is based on the bias control signal.

3. The sensor assembly of claim 2, the environmental sensor is a temperature sensor producing a variable reference signal having a positive or negative slope, and the environmental condition is temperature, wherein the bias voltage applied to the transducer changes in proportion to changes in temperature.

4. The sensor assembly of claim 2, the bias control circuit including a digital logic circuit coupled to the environmental sensor and configured to determine a bias adjust value based on the environmental sensor signal, wherein the bias control signal is based on the bias adjust value.

5. The sensor assembly of claim 4, wherein the environmental sensor produces a reference voltage having a positive or negative slope.

6. The sensor assembly of claim 5 is a microphone assembly and the transducer is a capacitive microelectromechanical systems (MEMS) transducer.

7. The sensor assembly of claim 2 is a microphone assembly further comprising a signal processing circuit coupled to the transducer, wherein the transducer is a capacitive microelectromechanical systems (MEMS) transducer having a capacitance on the order of 1 pF and the signal processing circuit has an input resistance on the order of 1 Gohm.

8. The sensor assembly of claim 7, wherein the environmental sensor is a temperature sensor integrated with the integrated circuit.

9. An integrated circuit for interfacing with a transducer of a sensor assembly, the integrated circuit comprising:
a signal processing circuit connectable to a transducer and configured to generate an output signal based on an electrical signal received from the transducer when the integrated circuit is interfaced with the transducer;
a transducer bias circuit connectable to the transducer and configured to apply a bias to the transducer when the integrated circuit is interfaced with the transducer; and
a bias control circuit coupled to the transducer bias circuit and configured to adjust the bias applied to the transducer based on an environmental sensor signal representative of a change in an environmental condition that affects drift in sensitivity of the transducer,
wherein adjustment of the bias compensates for drift in sensitivity of the transducer caused by the change in the environmental condition.

10. The integrated circuit of claim 9 further comprising an environmental sensor configured to generate the environmental sensor signal, the bias control circuit coupled to the environmental sensor and configured to generate a bias control signal based on the environmental sensor signal, wherein adjustment of the bias applied to the transducer is based on the bias control signal.

11. The integrated circuit of claim 10, the bias control circuit includes a reference input and is configured to generate the bias control signal based on the environmental sensor signal received at the reference input.

12. The integrated circuit of claim 11, the environmental sensor is a temperature sensor producing a variable reference signal having a positive or negative slope, and the environmental condition is temperature, wherein the bias voltage applied to the transducer changes in proportion to changes in temperature.

13. The integrated circuit of claim 10, wherein the environmental sensor is a pressure sensor, a temperature sensor, or a humidity sensor.

14. The integrated circuit of claim 10, the bias control circuit including a digital logic circuit coupled to the environmental sensor and configured to determine a bias adjust value based on the environmental sensor signal, wherein the bias control signal is based on the bias adjust value.

15. The integrated circuit of claim 14, the digital logic circuit coupled to a buffer having a reference output coupled to the transducer bias circuit, wherein the transducer bias circuit adjusts bias applied to the transducer based on a digital bias control signal applied to the buffer.

16. The integrated circuit of claim 15, wherein the environmental sensor signal has a reference voltage with a positive or negative slope.

17. The integrated circuit of claim 11 in combination with a capacitive microelectromechanical systems (MEMS) transducer.

18. A method of compensating for sensitivity drift of a transducer in a sensor assembly, the method comprising:
generating, by a sensor, an environmental sensor signal representative of a change in an environmental condition causing sensitivity drift in the transducer;
generating, by a bias control circuit including the sensor, a bias control signal based on the environmental sensor signal; and
compensating, by a transducer bias circuit coupled to the bias control circuit, for sensitivity drift of the transducer caused by the change in the environmental condition by adjusting a bias applied to the transducer based on the bias control signal.

19. The method of claim 18 further comprising adjusting the bias applied to the transducer by applying the bias control signal to a transducer bias circuit coupled to the transducer.

20. The method of claim 19 further comprising processing an electrical signal generated by the transducer biased by the transducer bias circuit.

* * * * *